United States Patent
McIntyre et al.

(10) Patent No.: US 6,756,536 B2
(45) Date of Patent: Jun. 29, 2004

(54) THERMOELECTRIC MICROACTUATOR

(75) Inventors: Thomas J. McIntyre, Nokesville, VA (US); Andrew TS Pomerene, Leesburg, VA (US)

(73) Assignee: Bae Systems Information and Electronic Systems Integration Inc., Nashua, NH (US)

( * ) Notice: Subject to any disclaimer, the term of this patent is extended or adjusted under 35 U.S.C. 154(b) by 143 days.

(21) Appl. No.: 10/109,074

(22) Filed: Mar. 28, 2002

(65) Prior Publication Data

US 2003/0183267 A1 Oct. 2, 2003

(51) Int. Cl.[7] .................. H01L 35/30; H01L 35/16; H01L 35/20; H01L 35/02; F25B 21/02
(52) U.S. Cl. ............... 136/242; 136/203; 136/238; 136/240; 62/3.3
(58) Field of Search ............... 136/203, 242, 136/238, 240; 62/3.3

(56) References Cited

U.S. PATENT DOCUMENTS

| | | | |
|---|---|---|---|
| 4,929,282 A | 5/1990 | Brun et al. | 136/239 |
| 5,188,286 A | 2/1993 | Pence, IV | 236/1 F |
| 5,429,680 A * | 7/1995 | Fuschetti | 136/203 |
| 5,448,109 A | 9/1995 | Cauchy | 257/719 |
| 5,588,295 A | 12/1996 | Brotz | 60/528 |
| 5,714,791 A | 2/1998 | Chi et al. | 257/467 |
| 5,817,188 A * | 10/1998 | Yahatz et al. | 136/237 |
| 5,894,260 A | 4/1999 | Cella et al. | 337/342 |
| 5,921,083 A | 7/1999 | Brotz | 60/528 |
| 6,039,262 A | 3/2000 | DeAnna | 236/93 R |
| 6,133,817 A | 10/2000 | Hofsäss et al. | 337/377 |
| 6,161,382 A | 12/2000 | Brotz | 60/528 |

FOREIGN PATENT DOCUMENTS

JP 06-101625 * 12/1994

* cited by examiner

Primary Examiner—Patrick Ryan
Assistant Examiner—Thomas H. Parsons
(74) Attorney, Agent, or Firm—Dicke, Billig & Czaja, PLLC

(57) ABSTRACT

A thermoelectric microactuator on a substrate includes a first temperature control element having a first surface bonded to the substrate and having a second surface. A first electrically nonconductive layer has a first surface bonded to the second surface of the first temperature control element and has a second surface. An actuator arm includes a first region bonded to the second surface of the first nonconductive layer and includes a flexure contiguously extending from the first region to an end cantilevered beyond the first nonconductive layer and forming an axis at the junction of the flexure and the first region. The first temperature control element controls the temperature of the actuator arm to thereby deflect the flexure about the axis.

31 Claims, 11 Drawing Sheets

THERMOELECTRIC MICROACTUATOR

THE FIELD OF THE INVENTION

The present invention relates generally to actuators, more particularly to a thermoelectric microactuator with active heating and cooling.

BACKGROUND OF THE INVENTION

Actuators are well known in the art and are useful for a variety of purposes. Actuators often comprise strips that are made of two or more layers of metal that are fused together, with the metal of some or all of the layers having different temperature coefficients of expansion. When heated, the differing coefficients of expansion among the layers will cause the strip to bend, with such movement thereby actuating a subsequent operation. The more the strip is heated, the more it will bend.

One example actuator uses a bimetallic strip, with two pieces of metal having differing coefficients of expansion fused together. When an electrical current is applied to the bimetallic strip, the resulting conduction produces heat, thereby bending the strip and actuating an associated operation. Another example actuator comprises a tri-metallic strip that utilizes the Peltier effect to produce a bending motion. Thermoelectric heaters/coolers using the Peltier effect are also known in the art and are used in a variety of devices.

In 1821, T. J. Seebeck discovered that an electric current is present in a series loop of two different metals when the junction points are at different temperatures. In 1834, J. Peltier discovered that when a current is circulated through the same series loop, one junction generates heat while the other junction absorbs heat (becomes cool). When the current is reversed, the heat generating and heat absorbing junctions are reversed. Modern Peltier devices may be composed of heavily doped series-connected semiconductor segments. Such semiconductors are described, for example, in the Brun et al. U.S. Pat. No. 4,929,282, the Cauchy U.S. Pat. No. 5,448,109, and the Chi et al. U.S. Pat. No. 5,714,791.

Actuators using the Peltier effect typically comprise tri-metallic strips with a center strip of one material having one coefficient of expansion sandwiched between the outer strips of another material having another coefficient of expansion. When an electrical current is applied to the strip in one direction, the strip bends one direction, and when an electrical current is applied the strip in the opposite direction, the strip bends in the opposite direction.

Actuators utilizing metallic strips have been incorporated into many devices and have been used to control the operation of windows, ducts, fire place dampers, and fire alarms and sprinklers. While the actuators utilized by these devices work well for such applications, they are relatively large in scale. With the advent and continued advancement of micro-mechanical technology, a much smaller microactuator would be beneficial. Actuators wherein the metallic strips are electrically isolated from electrical current sources providing the means for heating and cooling would also be desirable.

SUMMARY OF THE INVENTION

The present invention provides a thermoelectric microactuator on a substrate. The microactuator includes a first temperature control element having a first surface bonded to the substrate and a second surface. A first electrically nonconductive layer has a first surface bonded to the second surface of the first temperature control element and a second surface. An actuator arm has a first region bonded to the second surface of the first electrically nonconductive layer and a flexure contiguously extending from the first region to an end cantilevered beyond the first nonconductive layer and forming an axis at the junction of the flexure and the first region. The first temperature control element controls the temperature of the actuator arm to thereby deflect the flexure about the axis.

In one embodiment, the flexure has a normal position at an ambient design temperature and the degree of deflection from the normal position is proportional to the amount that the first temperature control element varies the temperature of the actuator arm from the ambient design temperature.

In one embodiment, the actuator arm is a bimetallic strip having a first layer comprising a first metallic alloy bonded to a second layer comprising a second metallic alloy. The first metallic alloy has a first thermal coefficient of expansion and the second metallic alloy has a second thermal coefficient of expansion.

In one embodiment, a surface of the actuator arm opposite a surface of the actuator arm opposite a surface bonded to the first electrically non-conductive layer is reflective to thereby redirect an incident light wave. In one embodiment, a micromirror is bonded to the end of the flexure to thereby redirect an incident light wave. In one embodiment, an electrically nonconductive segment is bonded between the end of the flexure and an electrical contact, wherein the electrical contact makes and/or breaks external electrical circuits.

In one embodiment, the first temperature control element transfers heat to and/or from the actuator arm via the first electrically non-conductive layer. In one embodiment, the first temperature control element is a thin-film resistive layer connectable to a power source. When a current passes through the thin-film resistive layer, the thin-film layer generates and transfers heat to the actuator arm via the first electrically nonconductive layer to thereby deflect the flexure about the axis. In one embodiment, the thin-film resistive layer is a polysilicon resistor.

In one embodiment, the first temperature control element comprises a Peltier device connectable to a power source. When a current passes through the Peltier device in a first direction, the Peltier device heats the actuator arm to thereby bend the flexure about the axis in a first direction. When a current passes through the Peltier device in a reverse direction, the Peltier device cools the actuator arm to thereby bend the flexure about the axis in a direction opposite of that when the actuator arm is heated.

In one embodiment, the Peltier device comprises a p-doped segment having a first and a second end, an n-doped segment having a first and second end, and a conductor segment coupled between the first ends of the p-doped and n-doped segments. A first contact is coupled to the second end of the p-doped segment, and a second contact is coupled to the second end of the n-doped segment. When an external power supply is coupled across the first and second contacts and a current is passed through the conductor segment in a first direction, the conductor segment cools. When a current passed through the conductor segment in an opposite direction, the conductor segment generates heat.

In one embodiment, the Peltier device comprises a plurality of p-doped segments, a plurality of n-doped segments, a first plurality of conductor segments bonded to the first electrically non-conductive layer with each having a first and second end, and a second plurality of conductor segments bonded to the substrate with each having a first and second end. The first ends of the conductor segments of the first plurality are coupled to the second ends of the conductor segments of the second plurality by p-doped segments and the second ends of the conductor segments of the first plurality are coupled to the first ends of the conductor segments of the second plurality to thereby form a chain having a first and second end. A pair of contacts, one coupled to each end of the chain, is connectable to a power supply.

In one embodiment, the Peltier device comprises bizmuth telluride. In one embodiment, the first electrically nonconductive layer is an oxide insulator.

In one embodiment, the thermoelectric microactuator further comprises a second temperature control element having a first surface bonded to the substrate and a second surface, and a second electrically nonconductive layer having a first surface bonded to the second surface of the second temperature control element and a second surface bonded to the first surface of the first electrically nonconductive layer. The first temperature control element controls the temperature of the actuator arm to deflect the flexure about the axis in a first direction, and the second temperature control element controls the temperature of the actuator arm to deflect the flexure about the axis in the first direction or a second direction opposite the first direction.

In one embodiment, the first temperature control element is a thin-film resistive layer connectable to a power supply and the second temperature control element is a Peltier device connectable to a power supply. When a current passes through the thin-film resistive, the thin-film layer heats the actuator arm to thereby deflect the flexure about the axis in a first direction. When a current passes through the Peltier device in a first direction, the Peltier device heats the actuator arm to thereby deflect the flexure about the axis in a first direction, and when a reverse current passes through the Peltier device the Peltier device cools the actuator arm to thereby deflect the flexure about the axis in a second direction opposite the first direction.

In one embodiment, the second electrically nonconductive layer is an oxide insulator. In one embodiment, the Peltier device of the second temperature control element comprises bizmuth telluride.

DESCRIPTION OF THE PREFERRED EMBODIMENTS

In the following detailed description of the preferred embodiments, reference is made to accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
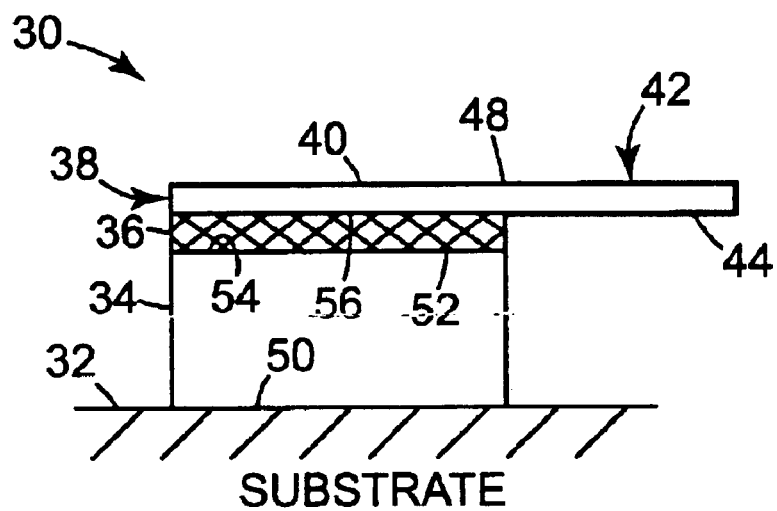
FIG. 1A is a diagram of one embodiment of a microactuator according to the present invention.
Figure 1B:
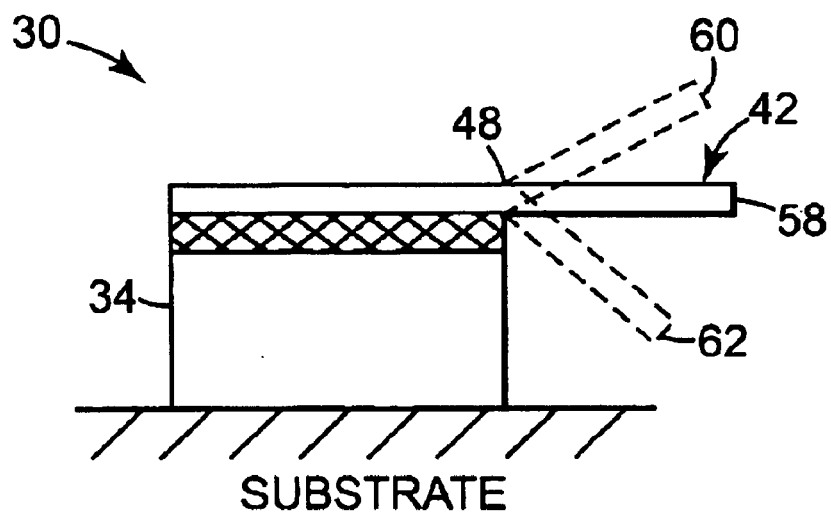
FIG. 1B is a diagram illustrating the operation of the embodiment of FIG. 1A.

One embodiment of a microactuator according to the present invention is illustrated generally at 30 in FIGS. 1A and 1B. Microactuator 30 includes a substrate material 32, a temperature control element 34, an electrically nonconductive layer 36, and an actuator arm 38. Actuator arm 38 further comprises a stationary region 40 and a flexure 42. Stationary region 40 is bonded to nonconductive layer 36, while flexure 42 extends from stationary region 40 to an end 44 beyond nonconductive layer 36. An axis 48 is formed at the junction of flexure 42 with stationary region 40.

Temperature control element 34 has a first surface 50 bonded to substrate 32 and a second surface 52. Nonconductive layer 36 has a first surface 54 bonded to temperature control element surface 52 and a second surface 56. Stationary region 40 of actuator arm 38 has a surface bonded to surface 56 of nonconductive layer 36.

As illustrated in FIG. 1B, when at an ambient temperature, flexure 42 has a normal position as indicated at 58. When temperature control element 36 varies the temperature from the ambient temperature, flexure 42 deflects from its normal position 58 around axis 48 to a position such as those indicated at 60 and 62. The degree of deflection of flexure 42 from normal position 58 is proportional to the amount that the temperature is varied from the ambient temperature by temperature control element 34.

Figure 2A:
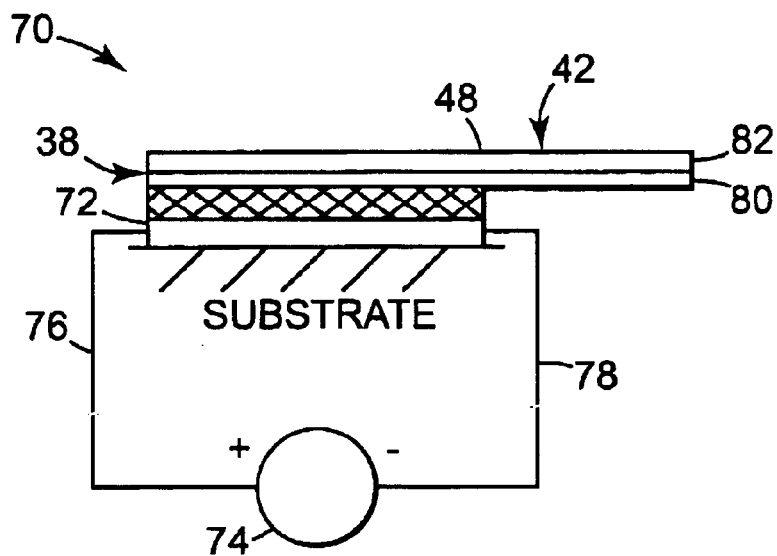
FIG. 2A is a diagram illustrating one embodiment of a microactuator according to the present invention.
Figure 2B:
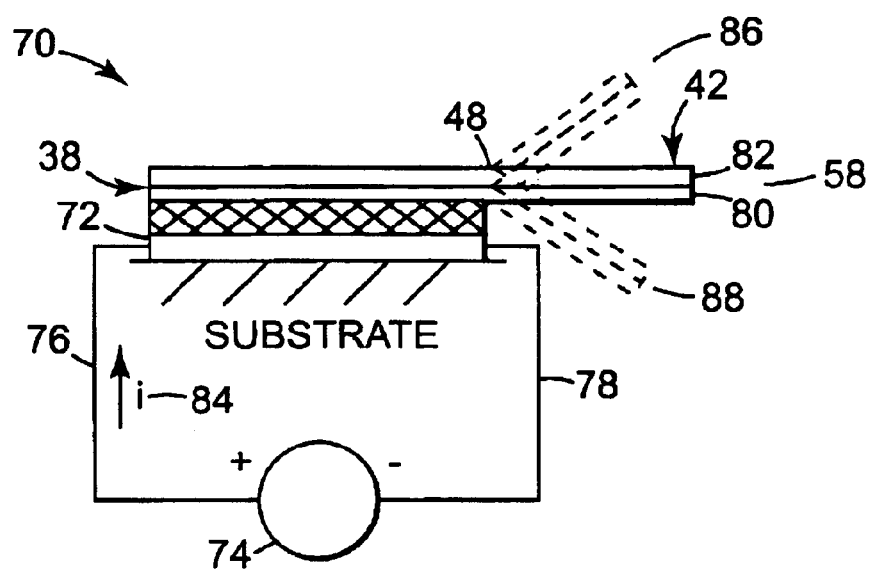
FIG. 2B is a diagram illustrating the operation of the embodiment of FIG. 2A.

In one embodiment of a microactuator according to the present invention, as illustrated generally at 70 in FIGS. 2A and 2B, temperature control element 34 is implemented in a thin-film resistive layer 72 connectable to an external power source 74 by lines 76 and 78. Actuator arm 38 comprises a bimetallic strip having a first layer 80 bonded to a second layer 82. Layer 80 comprises a first material having a first coefficient of expansion and layer 82 comprises a second material having a second coefficient of expansion.

As illustrated by FIG. 2B, when a DC voltage is applied across thin-film resistive layer 72 by power source 74, a current 84 flows through thin-film resistive layer 72, which consequently generates heat. The generated heat in-turn heats actuator arm 38. Due to the differing coefficients of expansion, first layer 80 and second layer 82 expand at different rates, causing flexure 42 to deflect around axis 48 from the normal position 58. If layer 80 expands at a rate greater than that of layer 82, flexure 42 deflects about axis 48 to a position such as that indicated at 86. Conversely, if layer 80 expands at a rate less than that of layer 82, flexure 42 deflects about axis 48 to a position such as that indicated at 88. The degree of deflection of flexure 42 about axis 48 is proportional to the amount of heat generated by thin-film resistive layer 72, which is in-turn proportional to the level of the current 84. The higher the level of current 84, the greater the degree of deflection of flexure 42 about axis 48.

Figure 3A:
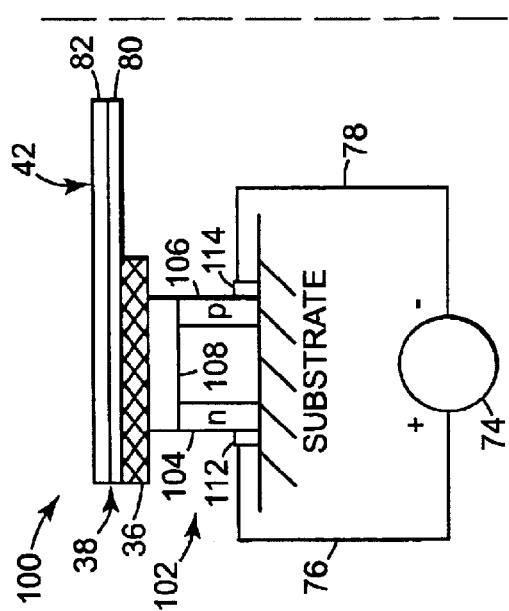
FIG. 3A is a diagram illustrating one embodiment of a microactuator according to the present invention.
Figure 3B:
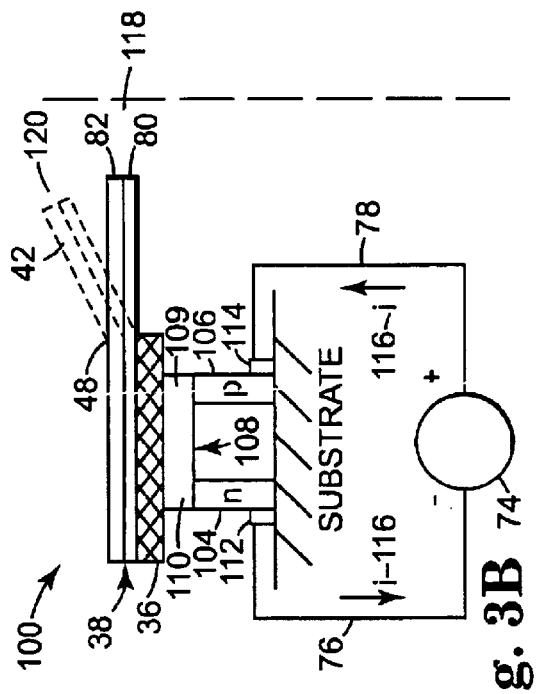
FIG. 3B is a diagram illustrating the operation of the embodiment of FIG. 3A.
Figure 3C:
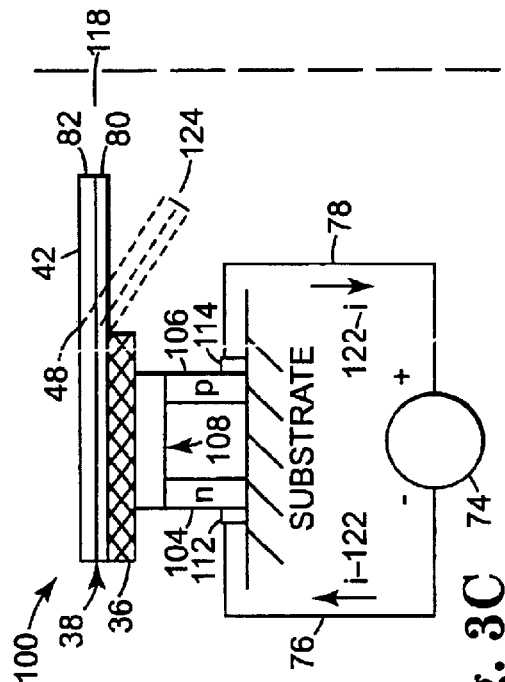
FIG. 3C is a diagram illustrating the operation of the embodiment of FIG. 3A.

One embodiment of a microactuator is generally illustrated at 100 in FIGS. 3A, 3B and 3C and includes a temperature control element implented in a Peltier device 102 connectable to external power supply 74 by lines 76 and 78. In 1821, T. J. Seebeck discovered that an electric current is present in a series loop of two different metals when the junction points are at different temperatures. In 1834, J. Peltier discovered that when a current is circulated through the same series loop, one junction generates heat while the other junction absorbs heat (i.e., becomes cool). When the current is reversed, the heat generating and heat absorbing junctions are reversed. Modern Peltier devices may be composed of heavily doped series-connected semiconductor segments. Such semiconductors are described, for example, in the Brun et al. U.S. Pat. No. 4,929,282, the Cauchy U.S. Pat. No. 5,448,109, and the Chi et al. U.S. Pat. No. 5,714,791.

As illustrated in FIG. 3A, Peltier device 102 comprises an n-doped segment 104, a p-doped segment 106, a conductor segment 108 forming a junction between n- and p-doped segments 104 and 106, and a pair of contact points 112 and 114. Conductor segment 108 has a surface bonded to a surface of electrically non-conductive layer 36 opposite the surface bonded to actuator arm 38. N-doped segment 104 has a first end coupled to a first end 110 of conductor segment 108 and a second end coupled to contact point 112. P-doped segment 106 has a first end coupled to a second end 110 of conductor segment 108, and a second end coupled to contact point 114. External power supply 74 is coupled to contact point 112 via line 76 and to contact point 114 via line 78. As before, actuator arm 38 is a bimetallic strip comprising layers 80 and 82 having different coefficients of expansion, and has a first region 40 bonded to first electrically non-conductive layer 36 and a flexure 42.

As illustrated by FIG. 3B, when power supply 74 provides a current 116 in a path from contact point 114, through p-doped segment 106, conductor segment 108, n-doped segment 104 and back to power supply 74 via contact point 112, cooling takes place at contact points 112 and 114 and heat flows to conductor segment 108. The heat generated by conductor segment 108 in-turn heats actuator arm 38. If the material of layer 80 has a higher coefficient of expansion than the material of layer 82, as actuator arm 38 is heated flexure 42 will deflect from a normal position 118 to a position such as that indicated at 120.

As illustrated by FIG. 3C, when power supply 74 is reversed and provides a current 122 in a path from power supply 74, through contact point 112, n-doped segment 104, conductor segment 108, p-doped segment 106, and back to power supply 74 via contact point 114, cooling takes place at conductor segment 108 and heat flows to contact points 112 and 114. As conductor segment 108 cools, actuator arm 38 also cools. If the material of layer 82 has a higher coefficient of expansion that the material of layer 83, as actuator arm 38 is cooled, flexure 42 will deflect from a normal position 118 to a position such as that indicated at 124.

Figure 4A:
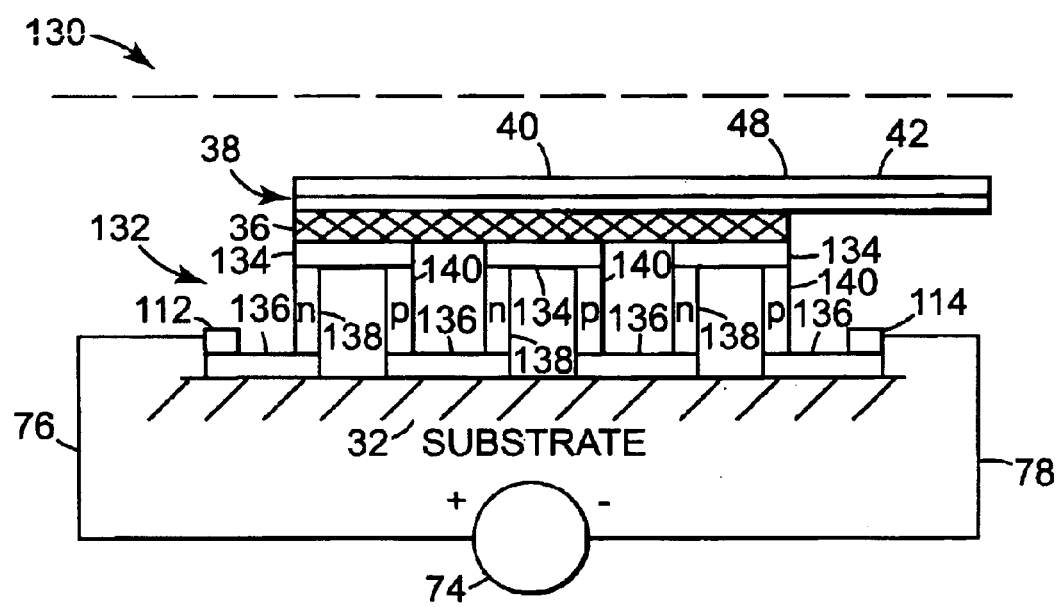
FIG. 4A is a diagram illustrating one embodiment of a microactuator according to the present invention.
Figure 4B:
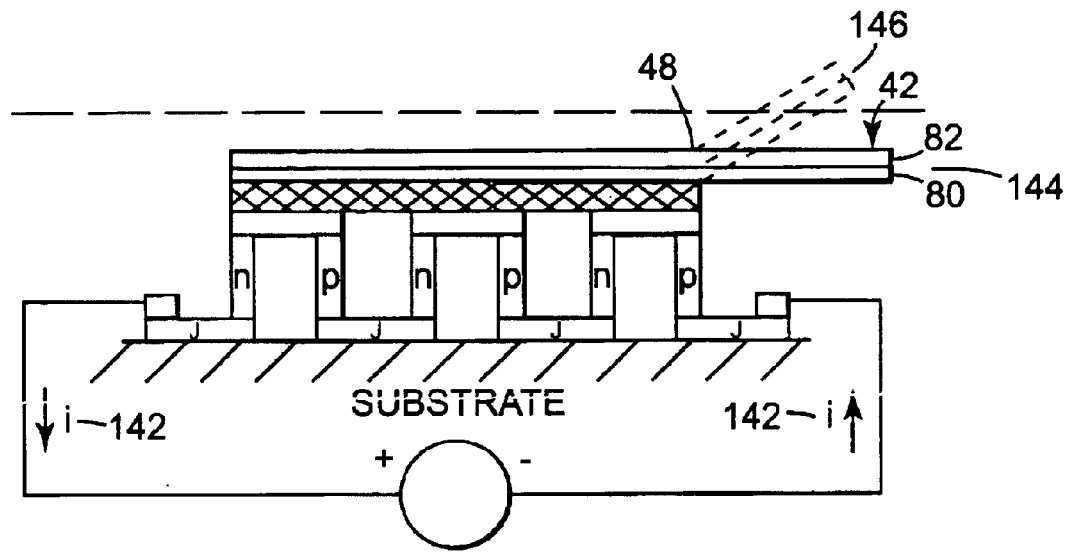
FIG. 4B is a diagram illustrating the operation of the embodiment of FIG. 4A.
Figure 4C:
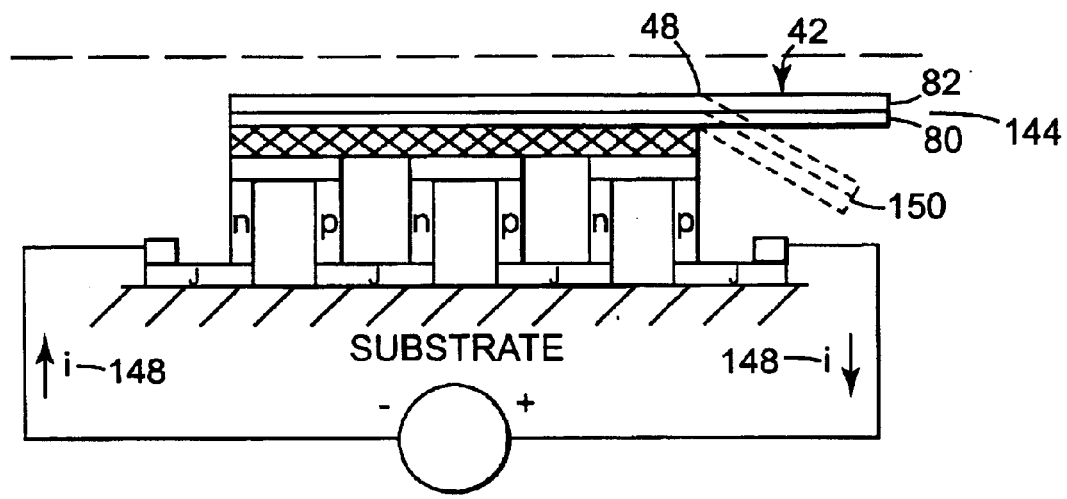
FIG. 4C is a diagram illustrating the operation of the embodiment of FIG. 4A.

In one embodiment of a microactuator according to the present invention, as illustrated generally at 130 in FIGS. 4A, 4B and 4C, a plurality of Peltier devices are coupled in a chain-like fashion to form a temperature control element 132. Temperature control element 132 comprises a first plurality of conductor segments 134 each having a first end and a second end, a second plurality of conductor segments 136 each having a first end and a second end, a plurality of n-doped segments 138, and a plurality of p-doped segments 140. The first plurality of conductor segments 134 each have a surface bonded to a surface of electrically nonconductive layer 36 opposite the surface of nonconductive layer 36 bonded to actuator arm 38, while the second plurality of conductor segments 136 each have a surface bonded to substrate 32. N-doped segments 138 bond the first ends of the conductor segments of the first plurality 134 to the second ends of the conductor segments of the second plurality 136 and p-doped segments 140 bond the second ends of the conductor segments of the first plurality 134 to the first ends of the conductor segments of the second plurality 136. Contact points 112 and 114 are coupled to the first and last conductor segments of the chain, to which external power supply 74 is coupled via lines 74 and 76. Again, actuator arm 38 is a bimetallic strip comprising layers 80 and 82 that have different coefficients of expansion, and having a first region 40 coupled to nonconductive layer 36 and a flexure 42.

As illustrated by FIG. 4B, when power supply 74 provides a current 142 in a path from contact point 114, through temperature control element 132, and back to power supply 74 via contact point 112, heat flows to the conductor segments of the first plurality 134, while the conductor segments of the second plurality 136 and contact points 112 and 114 are cooled. The heat from the first plurality of conductor segments 134 in-turn heats actuator arm 38. If layer 80 has a higher coefficient of expansion than layer 82, as actuator arm 38 is heated, flexure 42 will deflect from a normal position 144 to a position such as that indicated at 146.

As illustrated by FIG. 4C, when power supply 74 is reversed and provides a current 148 in a path from contact point 112, through temperature control element 132, and back to power supply 74 via contact point 114, heat flows to the conductor segments of the second plurality 136 and to contact point 112 and 114, while the conductor segments of the first plurality 134 are cooled. As the conductor segments of the first plurality 134 cool, actuator arm 38 also cools. If layer 82 has a higher coefficient of expansion than layer 80, as actuator arm 38 cools, flexure 42 will deflect from a normal position 144 to a position such as that indicated at 150.

Figure 5:
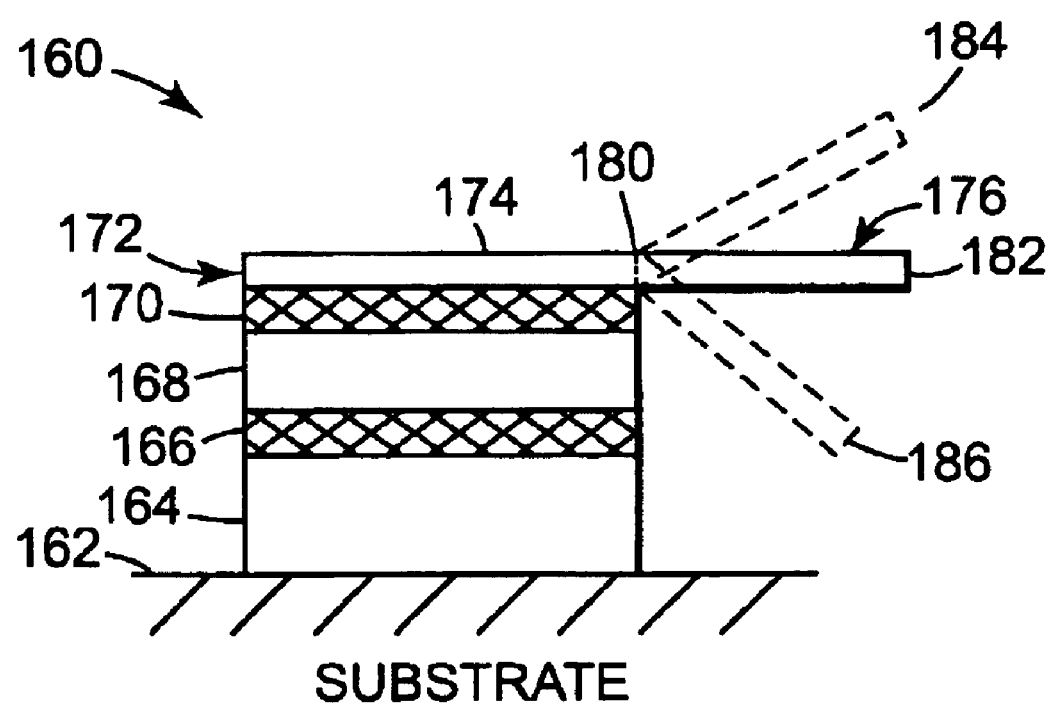
FIG. 5 is a diagram of one embodiment of a microactuator according to the present invention.

One embodiment of a microactuator according to the present invention is illustrated generally at 160 in FIG. 5. Microactuator 160 comprises a substrate 162, a first temperature control element 164, a first electrically non-conductive layer 166, a second temperature control element 168, a second electrically non-conductive layer 170, and an actuator arm 172.

First temperature control element 164 is bonded between substrate 162 and first electrically non-conductive layer 166 and second temperature control element 168 is bonded between first and second electrically non-conductive layers 166 and 170. Actuator arm 172 further comprises a stationary region 174 and a flexure 176. Stationary region 174 is bonded to second electrically non-conductive layer 170, while flexure 176 contiguously extends from stationary region 174 to an end 178 beyond non-conductive layer 170. An axis 180 is formed at the junction of flexure 176 with stationary region 174.

First and second temperature control elements work in conjunction to control the temperature of actuator arm 172. As illustrated in FIG. 5, flexure 176 has a normal position 182 at an ambient temperature. When temperature control elements 164 and 168 vary the temperature from the ambient temperature, flexure 176 deflects around axis 180 from normal position 182 to a position such as those indicated at 184 and 186. The degree of deflection of flexure 176 about axis 180 from normal position 182 is proportional to the amount that the temperature is varied from the ambient temperature by temperature control elements 164 and 168.

Figure 6A:
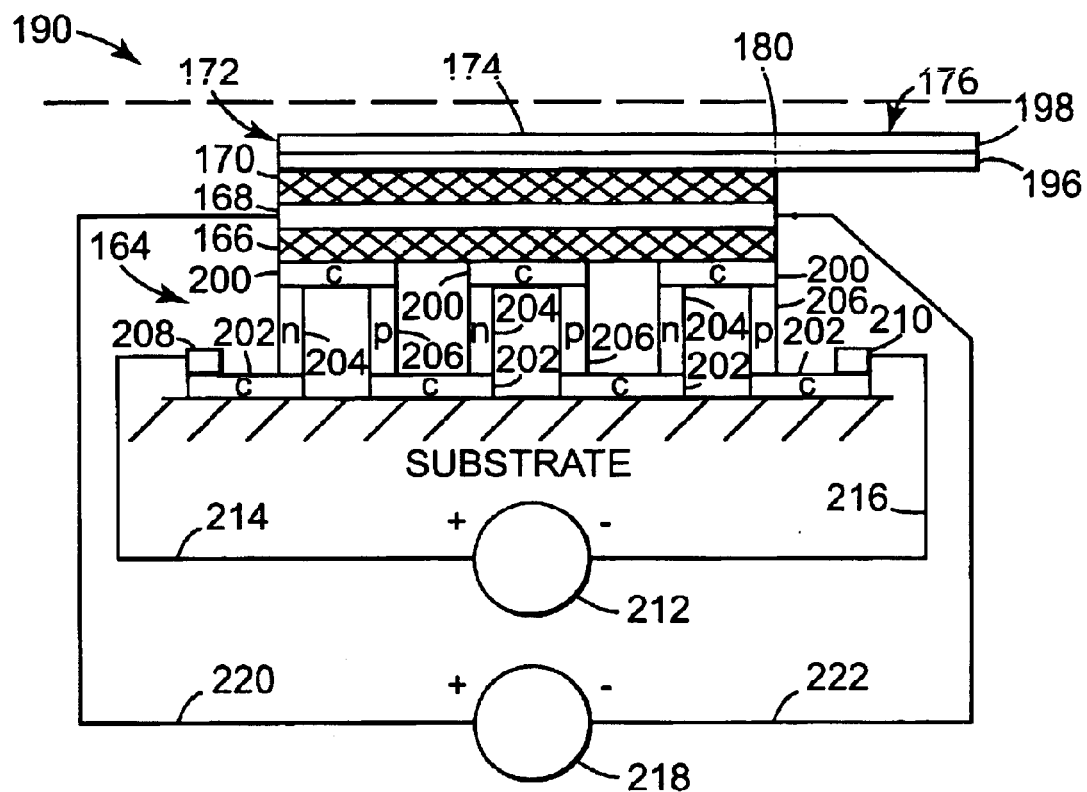
FIG. 6A is a diagram illustrating one embodiment of a microactuator similar in structure to the microactuator of FIG. 5.
Figure 6B:
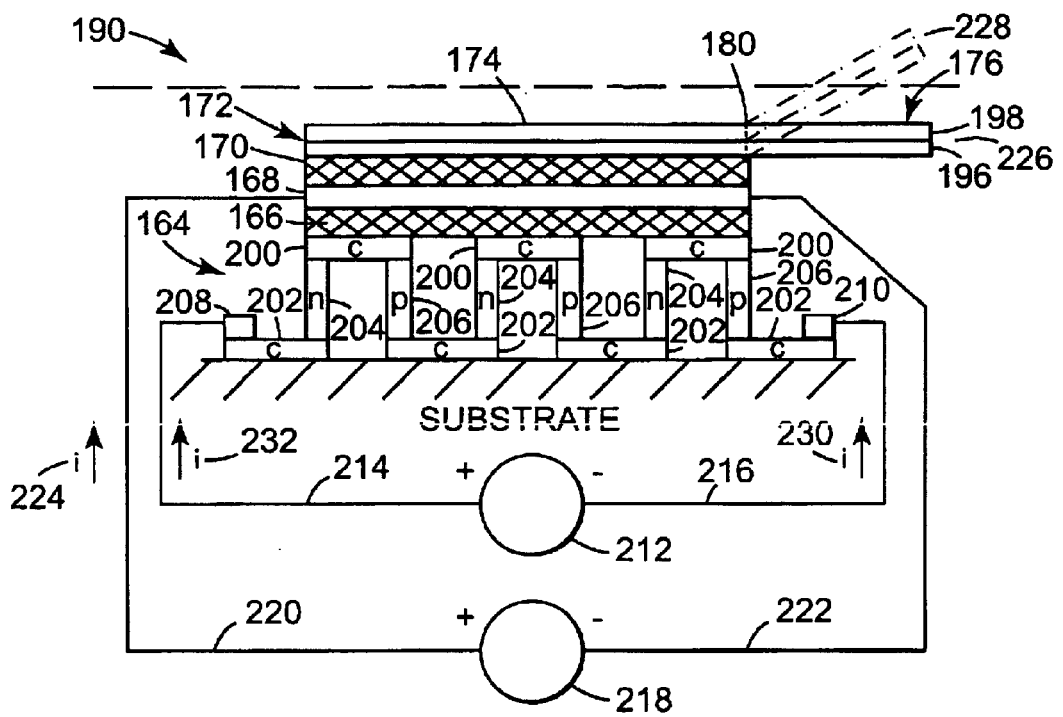
FIG. 6B is a diagram illustrating the operation of the embodiment of FIG. 6A.
Figure 6C:
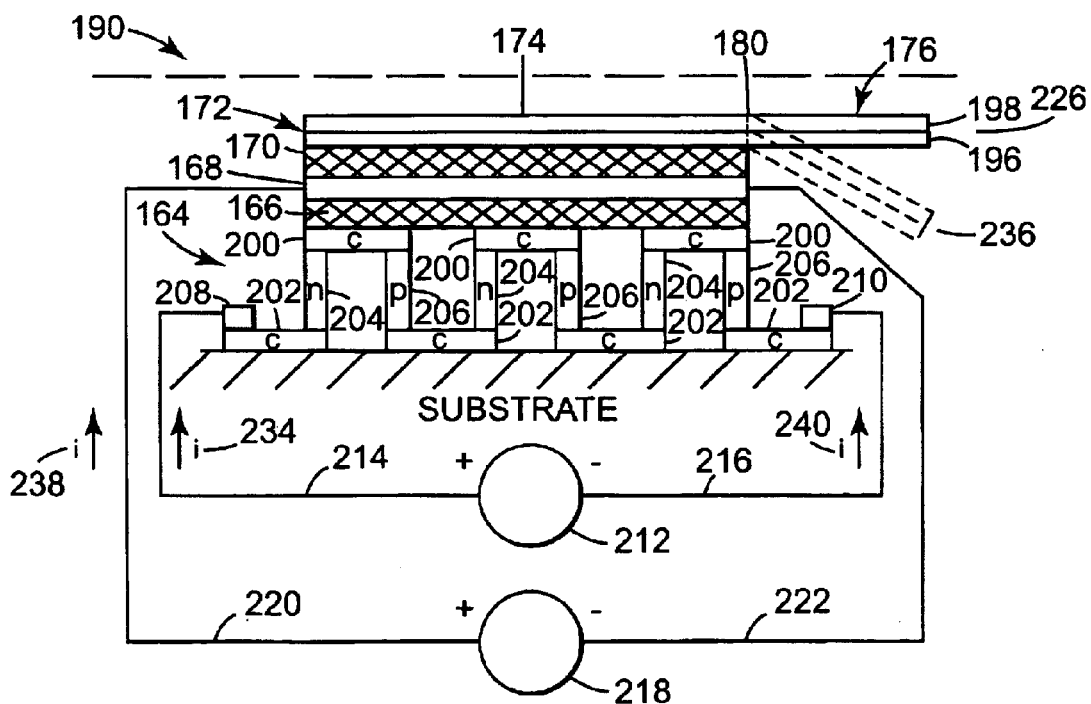
FIG. 6C is a diagram illustrating the operation of the embodiment of FIG. 6A.

One embodiment of a microactuator which is similar in structure to microactuator 160 of FIG. 5, is illustrated generally at 190 in FIGS. 6A, 6B and 6C. In FIG. 6A, a first temperature control element 164 comprises a plurality of Peltier devices coupled in a chain-like fashion similar to that of temperature control element 132 in FIG. 4A, while a second temperature control element 168 is a thin-film resistive layer similar to that of thin-film resistive layer 72 in FIG. 2A. Actuator arm 172 is a bimetallic strip comprising a first layer 196 having a first coefficient of expansion and a second layer 198 having a second coefficient of expansion.

First temperature control element 164 comprises a first plurality of conductor segments 200 each having a first and a second end, a second plurality of conductor segments 202 each having a first and a second end, a plurality of n-doped segments 204, and a plurality of p-doped segments 206. The conductor segments of the first plurality 200 each have a surface bonded to a surface of first electrically nonconductive layer 166, while the conductor segments of the second plurality each have a surface bonded to substrate 162. N-doped segments 204 bond the first end of the conductor segments of the first plurality 200 to the second ends of the conductor segments of the second plurality 202, while p-doped segments 206 bond the second end of the conductor segments of the first plurality 200 to the first ends of the conductor segments of the second plurality 202.

Contact points 208 and 210 are coupled to the first and last conductor segments of first temperature control element 164 and are coupled to a first external voltage source 212 via lines 214 and 216 respectively. Thin-film resistive layer 168 is coupled to a second external voltage source 218 via lines 220 and 222.

As illustrated by FIG. 6B, when power supply 218 provides a current 224 to thin-film resistive layer 168, thin-film resistive layer 168 generates heat which, in-turn, heats actuator arm 172 via non-conductive layer 170. As actuator arm 172 heats, if first layer 196 has a higher coefficient of expansion than second layer 198, flexure 176 will deflect about axis 180 from a normal position 226 to a position such as that indicated at 228. To increase the amount of heat provided to actuator arm 174, and thereby increase the rate at which flexure 176 will deflect from normal position 226 to position 228, power source 212 provides a current 230 to first temperature control element 164. As current 230 passes from contact point 210, through first temperature control element 164, and back to power source 212 via contact 208, heat flows to the conductor segments of the first plurality 200, while the conductor segments of the second plurality 202 become cool. The heat from the first plurality of conductor segments 200 adds to the heat produced by thin-film resistive layer 168 to heat actuator arm 172 more quickly, thereby more quickly deflecting flexure 176 from normal position 226 to position 228.

Flexure 176 is returned to normal position 226 from position 228 by removing currents 224 and 230. As actuator arm 172 cools, flexure 176 moves from position 228 toward normal position 226. When the actuator arm temperature reaches an ambient design temperature, flexure 176 will be at normal position 226. To increase the cooling rate of actuator arm 172, thereby increasing the rate at which flexure 176 returns to normal position 226, power source 212 provides a current 232 to first temperature control element 164. As current 232 passes through from contact point 208, through first temperature control element 164, and back to power source 212 via contact point 210, heat flows to the conductor segments of the second plurality 202, while the conductor segments of the first plurality 200 cool. Consequently, heat flows from actuator arm 172 to the first plurality of conductor segments 200, thereby more quickly deflecting flexure 176 from position 228 to normal position 226.

As illustrated by FIG. 6C, when power supply 212 provides a current 234 to first temperature control element 164, heat flows to the conductor segments of the second plurality 202, while the conductor segments of the first plurality 200 cool, thereby cooling actuator arm 172. As actuator arm 172 cools, if first layer 196 has a higher coefficient of expansion than second layer 198, flexure 176 will deflect about axis 180 from normal position 226 to a position such as that indicated at 236.

Flexure 176 is returned to normal position 226 from position 236 by removing current 234. As actuator arm 172 warms, flexure 176 deflects from position 236 toward normal position 226. When the actuator arm temperature equals the ambient design temperature, flexure 176 will be at normal position 226. To increase the warming rate of actuator arm 172, thereby increasing the rate at which flexure 176 returns to normal 226, power source 218 provides a current to thin-film resistive layer 168 and/or power source 212 provides a current 240 to first temperature control element 164. As current 238 passes through thin-film resistive layer 168, thin-film resistive layer 168 generates heat that is transferred to actuator arm 172 via second nonconductive layer 170. If more heat is desired, a current 240 is applied to first temperature control element 164 by voltage source 212. As current passes from contact point 210, through temperature control element 192, and back to voltage source 212 via contact point 208, heat flows to the conductor segments of the first plurality 200, while the conductor segments of the second plurality 202 cool. The heat from the first plurality of conductor segments 200 adds to the heat produced by thin-film resistive layer 168 to more quickly heat actuator 172, thereby more quickly deflecting flexure 176 from position 236 to normal position 226.

Figure 7:
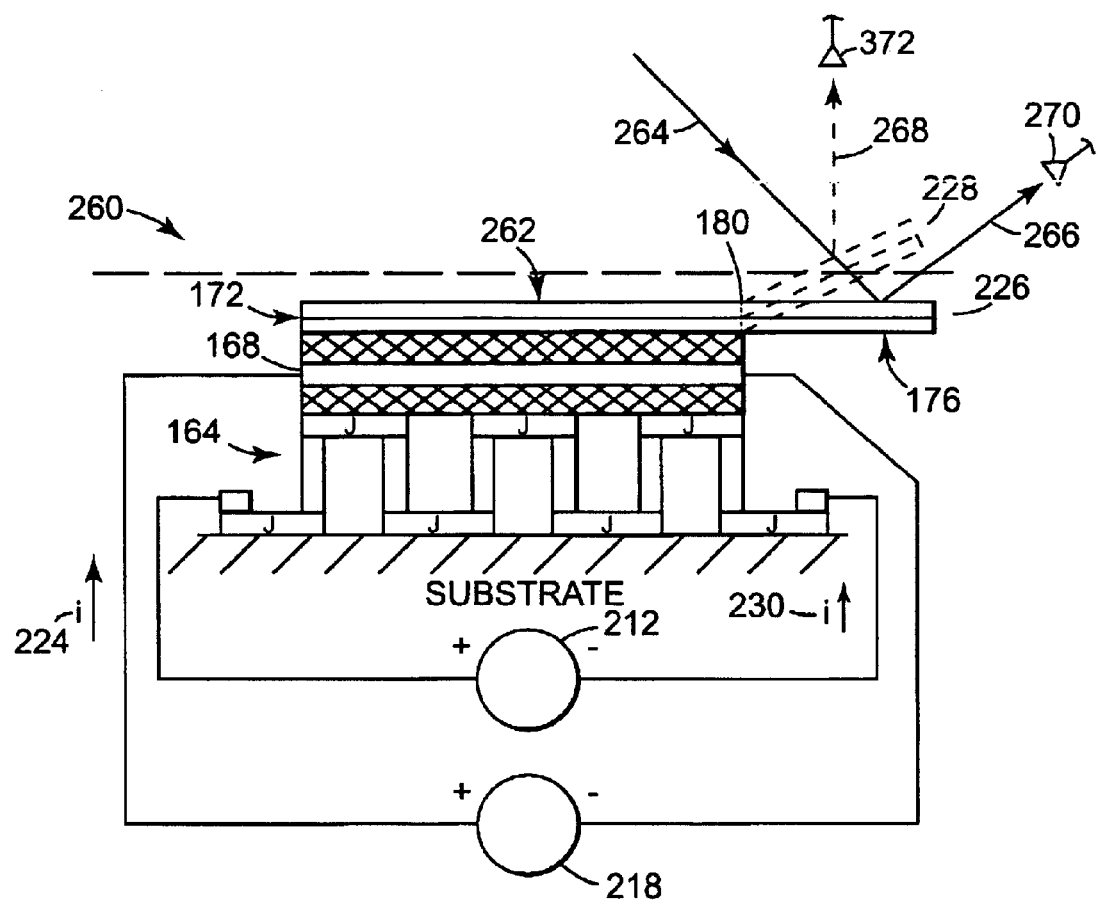
FIG. 7 is a diagram illustrating one embodiment of a microactuator similar in structure to the microactuator of FIG. 5.

One embodiment of a microactuator is generally illustrated at 260 in FIG. 7. Microactuator 260 is similar to microactuator 190 illustrated in FIG. 6A, but microactuator 260 further includes a reflective surface 262 on actuator arm 172. The reflective surface is used to steer, or control the direction of an incident light wave 264 in an opto-electronics application. When microactuator 260 is at an ambient design temperature, flexure 176 is at a normal position 226 and incident light wave 264 is reflected in a normal direction 266. When the temperature of actuator arm 172 is varied from the ambient design temperature, flexure 176 will deflect about axis 180 and re-direct incident light wave 262 in a direction different than that of normal direction 266.

For example, if actuator arm 172 is heated by voltage source 218 applying a current 224 to thin-film resistive layer 168 and/or voltage source 212 applying a current 230 to first temperature control element 164, flexure 176 deflects from normal position 226 to a position such as that indicated by 228. When at position 228, reflective surface 262 of flexure 176 deflects incident light wave 264 in a direction indicated by 268. When at normal position 226, flexure 176 directs incident light wave 264 to an exterior optical receiver 270 (or other exterior device), while when at position 228, flexure 176 directs incident light wave to an exterior optical receiver 372. The direction of reflection of incident light wave 264 can be reflected in a plurality of directions to a corresponding plurality of external optical receivers depending on the degree of deflection of flexure 176 about axis 180. Additionally, in one embodiment, the entire surface of actuator arm 176 is a reflective surface, while in another embodiment, only the surface of flexure 176 is reflective.

Figure 8:
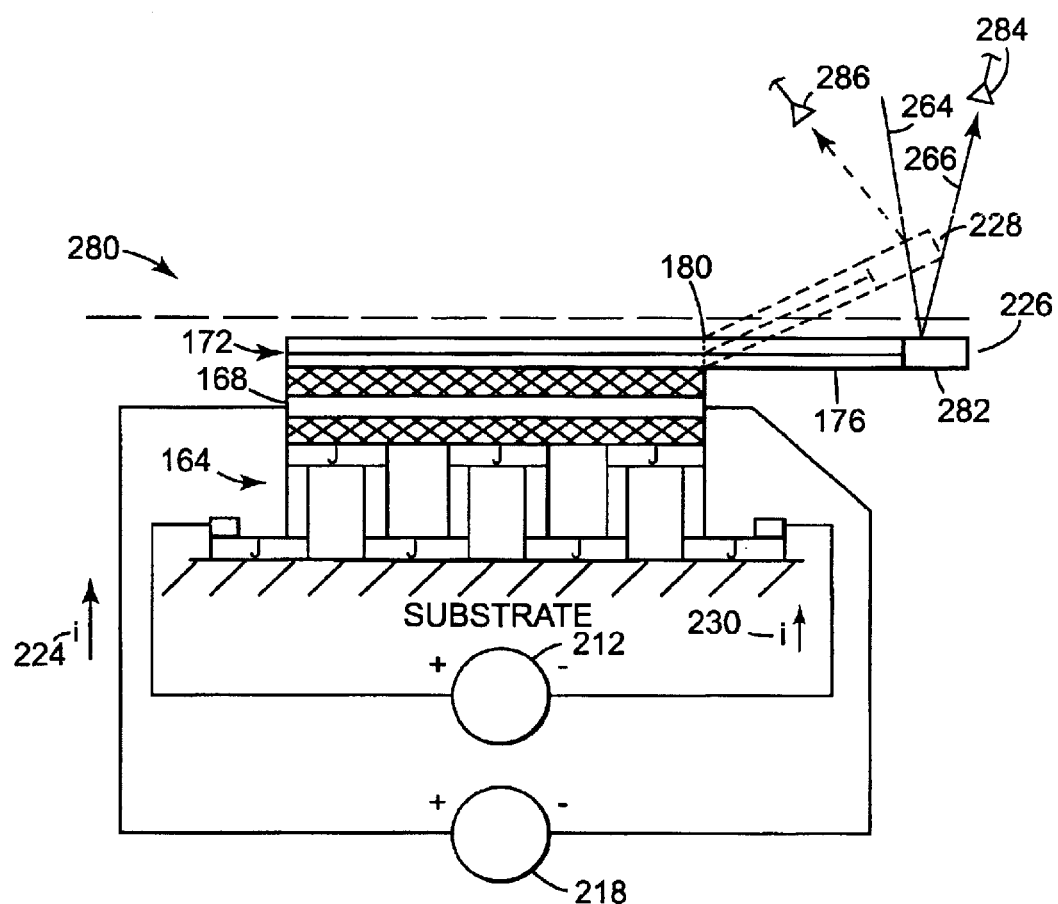
FIG. 8 is a diagram illustrating one embodiment of a microactuator similar in structure to the microactuator of FIG. 5.

One embodiment of a microactuator is generally illustrated at 280 in FIG. 8. Microactuator 280 is similar to microactuator 260 illustrated in FIG. 7, but in lieu of actuator arm 172 having a reflective surface, microactuator 280 includes a micromirror 282 bonded to flexure 176. Similar to the reflective surface 262 utilized by microactuator 260 of FIG. 7, micromirror 282 controls, or steers, the direction of an incident light wave 264. When microactuator 280 is at an ambient design temperature, flexure 176 is at a normal position 226 and micromirror 282 reflects incident light wave 264 in a normal direction 266. When the temperature of actuator arm 172 is varied from the ambient design temperature, flexure 176, along with micromirror 282, will deflect about axis 180 and re-direct incident light wave 262 in a direction different than that of normal direction 266.

For example, if actuator arm 172 is heated by voltage source 218 applying a current 224 to thin-film resistive layer 168 and/or voltage source 212 applying a current 230 to first temperature control element 164, flexure 176 deflects from normal position 226 to a position such as that indicated by 228. When at position 228, micromirror 282 directs incident light wave 264 in a direction indicated by 268. When at normal position 226, micromirror 282 directs incident light wave 264 to an exterior optical receiver 284 (or other exterior device), while when at position 228, micromirror 282 directs incident light wave to an exterior optical receiver 286. The direction of reflection of incident light wave 264 can be reflected in a plurality of directions to a corresponding plurality of external optical receivers depending on the degree of deflection of flexure 176, and thus micromirror 282 about axis 180.

Figure 9A:
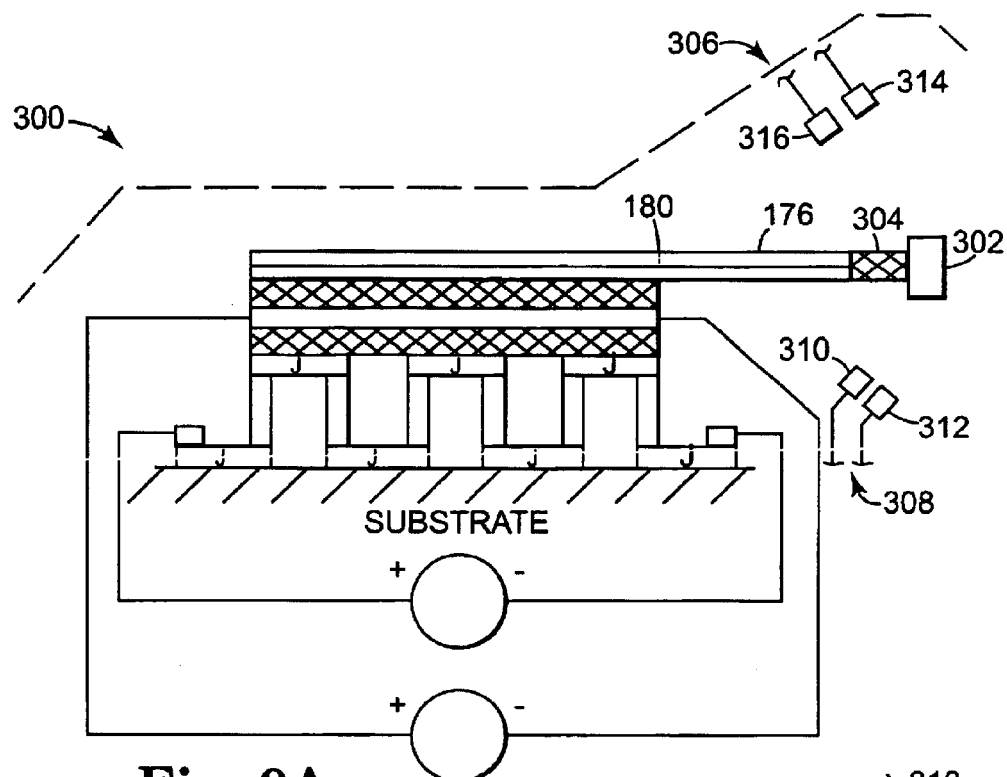
FIG. 9A is a diagram illustrating one embodiment of a microactuator similar in structure to the microactuator of FIG. 5.

One embodiment of a microactuator is generally illustrated at 300 in FIG. 9A. Microactuator 300 is similar to microactuator 190 of FIG. 6A, but microactuator 300 further includes an electrical contact 302 that is bonded to the end of flexure 176 via an electrically non-conductive segment 304. Flexure 176, in conjunction with electrically contact 302, serves as a switch to make-or-break external electrical circuits 306 and 308 at external contacts 310, 312, 314 and 316. Electrically non-conductive layer 304 serves to insulate bimetallic actuator arm 172 from any external power source contacted by electrical contact 302. When microactuator 300 is at an ambient design temperature, flexure 176 is at a normal position 226 and external electrical circuit 306 and 308 are both open and not conducting current.

Figure 9B:
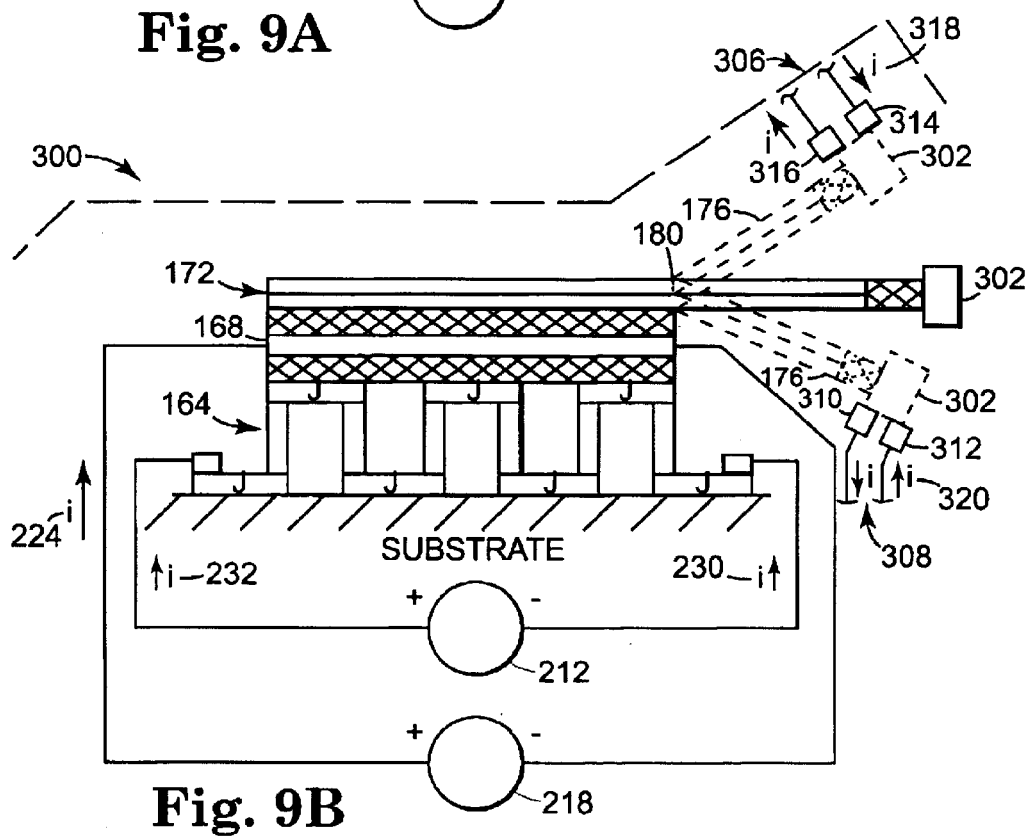
FIG. 9B is a diagram illustrating the operation of the embodiment of FIG. 9A.

As illustrated by FIG. 9B, when a current 224 is provided by voltage source 218 to thin-film resistive layer 168 and/or a current 230 is provided by voltage source 212 to first temperature control element 164, actuator arm 172 is heated. As actuator arm 172 is heated, flexure 176, along with electrical contact 302, deflects around axis 180 from normal position 226 to position 228. When flexure 176 reaches position 228, electrical contact 302 makes contact with external electrical contacts 314 and 316, thereby completing external circuit 306 and providing a path for a current 318 to pass through external contacts 314 and 316 via electrical contact 318.

Conversely, as also illustrated by FIG. 9B, when a current 232 is provided by voltage source 212 to first temperature control element 164, actuator arm 172 is cooled. As actuator arm 172 cools, flexure 176, along with electrical contact 302, deflects about axis 180 from normal position 226 to position 236. When flexure 176 reaches position 236, electrical contact 302 makes contact with external electrical contacts 310 and 312, thereby completing external circuit 308 and providing a path for a current 320 to pass through external contacts 310 and 312 via electrical contact 302.

In conclusion, the thermoelectric microactuator of the present invention provides an actuator on a scale available for use in micro-mechanical applications. Additionally, the inclusion of both active heating and cooling elements provides for precise control of the actuator in dual directions. Also, the present invention provides control of the actuator control without electrifying the actuator arm. Furthermore, the thermoelectric microactuator of the present invention can be constructed utilizing currently available techniques and materials.

Although specific embodiments have been illustrated and described herein for purposes of description of the preferred embodiments, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A thermoelectric microactuator on a substrate, the microactuator comprising:

a first temperature control element having a first surface bonded to the substrate and having a second surface;

a first electrically nonconductive layer having a first surface bonded to the second surface of the first temperature control element, and having a second surface; and an actuator arm, the actuator arm comprising:

a first region bonded to the second surface of the first nonconductive layer;

a flexure contiguously extending from the first region to an end cantilevered beyond the first nonconductive layer and forming an axis at the junction of the flexure and the first region, wherein the first temperature control element controls the temperature of the actuator arm to thereby deflect the flexure about the axis; and a reflective surface configured to reflect an incident light wave.

2. The microactuator of claim 1, wherein the flexure has a normal position at an ambient design temperature and the degree of deflection from the normal position is proportional to the amount that the first temperature control element varies the temperature of the actuator arm from the ambient design temperature.

3. The microactuator of claim 1, wherein the actuator arm includes a bimetallic strip having a first layer comprising a first metallic alloy having a first thermal coefficient of expansion bonded to a second layer comprising a second metallic alloy having a second thermal coefficient of expansion.

4. The microactuator of claim 1, wherein the reflective surface comprises a surface of the actuator arm opposite a surface bonded to the first nonconductive layer.

5. The microactuator of claim 1, wherein the reflective surface comprises a micromirror bonded to the end of the flexure.

6. The microactuator of claim 1, wherein the first temperature control element transfers heat to and/or from the actuator arm via the first electrically nonconductive layer.

7. The microactuator of claim 1, wherein the first temperature control element comprises a Peltier device connectable to a power source, wherein when a current passes through the Peltier device in a first direction the Peltier device heats the actuator arm to thereby bend the flexure about the axis in a first direction, and when a current passes through the Peltier device in a reverse direction, the Peltier device cools the actuator arm to thereby bend the flexure about the axis in a direction opposite of that when the actuator arm is heated.

8. The microactuator of claim 7, wherein the Peltier device comprises:

a p-doped segment having a first and second end;

an n-doped segment having a first and second end;

a conductor segment coupled between the first ends of the p-doped and n-doped segments;

a first contact coupled to the second end of the p-doped segment; and a second contact coupled to the second end of the n-doped segment, wherein when an external power supply is coupled across the first and second contacts and a current is passed through the conductor segment in a first direction the conductor segment cools, and when a current is passed through the conductor in an opposite direction the conductor segment generates heat.

9. The microactuator of claim 7, wherein the Peltier device comprises:

a plurality of p-doped segments;

a plurality of n-doped segments;

a first plurality of conductor segments bonded to the first electrically nonconductive layer with each having a first and second end;

a second plurality of conductor segments bonded to the substrate, each having a first and second end; wherein the first ends of the conductor segments of the first plurality are coupled to the second ends of the conductor segments of the second plurality by p-doped segments and the second ends of the conductor segments of the first plurality are coupled to the first ends of the conductor segments of the second plurality by n-doped segments, thereby forming a chain having a first and second end; and a pair of contacts, one coupled to each end of the chain, connectable to a power supply.

10. The microactuator of claim 7, wherein the Peltier device comprises bizmuth telluride.

11. The microactuator of claim 1, wherein the first electrically nonconductive layer comprises an oxide insulator.

12. The thermoelectric microactuator of claim 1, further comprising:

a second temperature control element having a first surface bonded to the substrate, and having a second surface; and a second electrically nonconductive layer having a first surface bonded to the second surface of the second temperature control element and a second surface bonded to the first surface of the first temperature control element, wherein the first temperature control element controls the temperature of the actuator arm to deflect the flexure about the axis in a first direction and the second temperature control element controls the temperature of the actuator arm to deflect the flexure about the axis in the first direction or a second direction opposite the first direction.

13. The microactuator of claim 12, wherein the second electrically nonconductive layer comprises an oxide insulator.

14. The microactuator of claim 12, wherein the first temperature control element comprises a thin-film resistive layer connectable to a power supply and the second temperature control element comprises a Peltier device connectable to a power supply, wherein when a current is passed through the thin-film restive layer the thin-film resistive layer heats the actuator arm to thereby deflect the flexure about the axis in a first direction, and wherein when a current passes through the Peltier device in a first direction the Peltier device heats the actuator arm to thereby defect the flexure about the axis in the first direction and when a current passes through the Peltier device in a reverse direction the Peltier device cools the actuator arm to thereby deflect the flexure about the axis in direction opposite the first direction.

15. The microactuator of claim 14, wherein the Peltier device comprises:

a p-doped segment having a first and second end;

an n-doped segment having a first and second end;

a conductor segment coupled between the first ends of the p-doped and n-doped segments;

a first contact coupled to the second end of the p-doped segment; and a second contact coupled to the second end of the n-doped segment, wherein when an external power supply is coupled across the first and second contacts and a current is passed through the conductor segment in a first direction the conductor segment cools, and when a current is passed through the conductor in an opposite direction the conductor segment generates heat.

16. The microactuator of claim 14, wherein the Peltier device comprises:

a plurality of p-doped segments;

a plurality of n-doped segments;

a first plurality of conductor segments bonded to the first electrically nonconductive layer with each having a first and second end;

a second plurality of conductor segments bonded to the substrate, each having a first and second end, wherein the first ends of the conductor segments of the first plurality are coupled to the second ends of the conductor segments of the second plurality by p-doped segments and the second ends of the conductor segments of the first plurality are coupled to the first ends of the conductor segments of the second plurality by n-doped segments, thereby forming a chain having a first and second end; and a pair of contacts, one coupled to each end of the chain, connectable to a power supply.

17. The microactuator of claim 14, wherein the Peltier device comprises bizmuth telluride.

18. A thermoelectric microactuator on a substrate, the microactuator comprising:

a first temperature control element having a first surface bonded to the substrate and having a second surface;

a first electrically nonconductive layer having a first surface bonded to the second surface of the first temperature control element, and having a second surface;

an actuator arm, the actuator arm comprising:
a first region bonded to the second surface of the first nonconductive layer; and
a flexure contiguously extending from the first region to an end cantilevered beyond the first nonconductive layer and forming an axis at the junction of the flexure and the first region, wherein the first temperature control element controls the temperature of the actuator arm to thereby deflect the flexure about the axis;

an electrical contact; and an electrically nonconductive segment bonded between the end of the flexure and the electrical contact, wherein the electrical contact makes and/or breaks external electrical circuits.

19. The microactuator of claim 18, wherein the actuator arm includes a bimetallic strip having a first layer comprising a first metallic alloy having a first thermal coefficient of expansion bonded to a second layer comprising a second metallic alloy having a second thermal coefficient of expansion.

20. The microactuator of claim 18, wherein the first temperature control element comprises a thin-film resistive layer connectable to a power source, wherein when a current passes through the thin-film resistive layer, the thin-film resistive layer generates and transfers heat to the actuator arm via the first electrically nonconductive layer to thereby deflect the flexure about the axis.

21. The microactuator of claim 18, wherein the first temperature control element comprises a Peltier device connectable to a power source, wherein when a current passes through the Peltier device in a first direction the Peltier device heats the actuator arm to thereby bend the flexure about the axis in a first direction, and when a current passes through the Peltier device in a reverse direction, the Peltier device cools the actuator arm to thereby bend the flexure about the axis in a direction opposite of that when the actuator arm is heated.

22. A thermoelectric microactuator on a substrate, the microactuator comprising:

a thin-film resistive layer connectable to a power source, and having a first surface bonded to the substrate and having a second surface;

a first electrically nonconductive layer having a first surface bonded to the second surface of the first temperature control element, and having a second surface;

an actuator arm, the actuator arm comprising:

a first region bonded to the second surface of the first nonconductive layer; and a flexure contiguously extending from the first region to an end cantilevered beyond the first nonconductive layer and forming an axis at the junction of the flexure and the first region, wherein when a current passes through the thin-film resistive layer, the thin-film resistive layer generates and transfers heat to the actuator arm via the first electrically nonconductive layer to thereby deflect the flexure about the axis.

23. The microactuator of claim 22, wherein the thin-film resistive layer includes a polysilicon resistor.

24. The microactuator of claim 22, wherein a surface of the actuator arm opposite a surface bonded to the first nondconductive layer is reflective to thereby redirect an incident light wave.

25. The microactuator of claim 22, wherein a micromirror is bonded to the end of the flexure to thereby redirect an incident light wave.

26. A thermoelectric microactuator on a substrate, the microactuator comprising:

a first temperature control element having a first surface and a second surface;

a first electrically nonconductive layer having a first surface bonded to the second surface of the first temperature control element and having a second surface;

a second temperature control element having a first surface bonded to the substrate and having a second surface;

a second electrically nonconductive layer having a first surface bonded to the second surface of the second temperature control element and a second surface bonded to the first surface of the first temperature control element; and an actuator arm, the actuator arm comprising:
a first region bonded to the second surface of the first nonconductive layer; and
a flexure contiguously extending from the first region to an end cantilevered beyond the first nonconductive layer and forming an axis at the junction of the flexure and the first region, wherein the first temperature control element controls the temperature of the actuator arm to deflect the flexure about the axis in a first direction and the second temperature control element controls the temperature of the actuator arm to deflect the flexure about the axis in the first direction or a second direction opposite the first direction.

27. The microactuator of claim 26, wherein the second electrically nonconductive layer comprises an oxide insulator.

28. The microactuator of claim 26, wherein the first temperature control element comprises a thin-film resistive layer connectable to a power supply and the second temperature control element comprises a Peltier device connectable to a power supply, wherein when a current is passed through the thin-film restive layer the thin-film resistive layer heats the actuator arm to thereby deflect the flexure about the axis in a first direction, and wherein when a current passes through the Peltier device in a first direction the Peltier device heats the actuator arm to thereby defect the flexure about the axis in the first direction and when a current passes through the Peltier device in a reverse direction the Peltier device cools the actuator arm to thereby deflect the flexure about the axis in direction opposite the first direction.

29. The microactuator of claim 28, wherein the Peltier device comprises:
- a p-doped segment having a first and second end;
- an n-doped segment having a first and second end;
- a conductor segment coupled between the first ends of the p-doped and n-doped segments;
- a first contact coupled to the second end of the p-doped segment; and
- a second contact coupled to the second end of the n-doped segment, wherein when an external power supply is coupled across the first and second contacts and a current is passed through the conductor segment in a first direction the conductor segment cools, and when a current is passed through the conductor in an opposite direction the conductor segment generates heat.

30. The microactuator of claim 28, wherein the Peltier device comprises:
- a plurality of p-doped segments;
- a plurality of n-doped segments;
- a first plurality of conductor segments bonded to the first electrically nonconductive layer with each having a first and second end;
- a second plurality of conductor segments bonded to the substrate, each having a first and second end, wherein the first ends of the conductor segments of the first plurality are coupled to the second ends of the conductor segments of the second plurality by p-doped segments and the second ends of the conductor segments of the first plurality are coupled to the first ends of the conductor segments of the second plurality by n-doped segments, thereby forming a chain having a first and second end; and
- a pair of contacts, one coupled to each end of the chain, connectable to a power supply.

31. The microactuator of claim 28, wherein the Peltier device comprises bismuth telluride.

* * * * *